(12) United States Patent
Yoshida et al.

(10) Patent No.: US 10,391,640 B1
(45) Date of Patent: Aug. 27, 2019

(54) ROBOT

(71) Applicants: KAWASAKI JUKOGYO KABUSHIKI KAISHA, Kobe-shi, Hyogo (JP); KAWASAKI ROBOTICS (USA), INC., Wixom, MI (US)

(72) Inventors: Tetsuya Yoshida, Kakogawa (JP); Avish Ashok Bharwani, Santa Clara, CA (US)

(73) Assignees: KAWASAKI JUKOGYO KABUSHIKI KAISHA, Kobe-Shi (JP); KAWASAKI ROBOTICS (USA), INC., Wixom, MI (US)

( * ) Notice: Subject to any disclaimer, the term of this patent is extended or adjusted under 35 U.S.C. 154(b) by 0 days.

(21) Appl. No.: 16/127,418

(22) Filed: Sep. 11, 2018

(51) Int. Cl.
*B25J 9/04* (2006.01)
*B25J 9/06* (2006.01)
*B25J 18/04* (2006.01)
*H01L 21/677* (2006.01)
*B25J 15/00* (2006.01)

(52) U.S. Cl.
CPC ........... *B25J 15/0052* (2013.01); *B25J 9/042* (2013.01); *B25J 9/06* (2013.01); *B25J 18/04* (2013.01); *H01L 21/67742* (2013.01)

(58) Field of Classification Search
CPC ..... B25J 9/042; B25J 9/043; B25J 9/06; B25J 11/0095; B25J 15/0052; B25J 18/04; H01L 21/67742; H01L 21/68707
USPC ....................................... 294/213; 414/744.5
See application file for complete search history.

(56) References Cited

U.S. PATENT DOCUMENTS

| | | | | |
|---|---|---|---|---|
| 4,787,813 A * | 11/1988 | Stevens | .................... | B25J 9/042 403/109.7 |
| 6,189,404 B1 * | 2/2001 | Hatake | .................... | B25J 9/107 310/103 |
| 6,267,549 B1 * | 7/2001 | Brown | .................... | B25J 9/107 414/744.5 |
| 6,326,755 B1 * | 12/2001 | Babbs | .................... | B25J 9/042 318/568.11 |
| 6,893,204 B1 * | 5/2005 | Suzuki | ................ | B65G 49/067 414/744.5 |
| 9,076,830 B2 * | 7/2015 | Kremerman | ...... | H01L 21/67742 |
| 9,186,799 B2 * | 11/2015 | Caveney | .................. | B25J 18/04 |
| 9,254,566 B2 * | 2/2016 | Hashimoto | .............. | B25J 9/042 |
| 9,761,478 B2 * | 9/2017 | Caveney | .......... | H01L 21/68707 |
| 2018/0053672 A1 | 2/2018 | Goto | | |

FOREIGN PATENT DOCUMENTS

| | | |
|---|---|---|
| JP | 2007-038360 A | 2/2007 |
| JP | 2016-015854 A | 1/2016 |
| JP | 2016-162936 A | 9/2016 |

\* cited by examiner

*Primary Examiner* — Dean J Kramer
(74) *Attorney, Agent, or Firm* — Oliff PLC

(57) ABSTRACT

A wrist joint structure in which a direct drive motor is used is provided in a robot in which two hands are mounted on one robot arm. The robot includes: a robot arm; a plurality of stages of hands including a first hand and a second hand that are provided at a tip of the robot arm; a first direct drive motor in which a rotation axis is defined at the tip of the robot arm, the first direct drive motor coupling the first hand to the tip of the robot arm such that the first hand is rotatable about the rotation axis; and a second direct drive motor that couples the second hand to the first hand such that the second hand is rotatable about the rotation axis.

3 Claims, 4 Drawing Sheets

ROBOT

BACKGROUND OF THE INVENTION

(1) Field of the Invention

The present invention relates to a robot having two hands.

(2) Description of Related Art

Conventionally, there is known a robot including a robot arm in which a plurality of stages of hands are attached to a hand of one robot arm. Japanese Patent Laid-open Publication No. 2016-162936 discloses this kind of robot.

A substrate transfer robot described in Japanese Patent Laid-open Publication No. 2016-162936 includes a robot arm constructed with a plurality of links rotatably connected to each other with a joint interposed therebetween and an upper hand and a lower hand that are attached to a tip of the robot arm. Each of the upper hand and the lower hand includes a hand base and a blade member supported by the hand base. A hollow shaft-shaped inside wrist shaft is fixed to the hand base of the upper hand, a hollow shaft-shaped outside wrist shaft is fixed to the hand base of the lower hand, the inside wrist shaft is coaxially inserted in the outside wrist shaft, and the inside wrist shaft and the outside wrist shaft are rotationally driven by independent drive sources.

A direct drive system in which each joint is directly driven by an independent motor is known as a drive system for the joint of the robot arm. For example, an articulated transfer device (horizontal articulated robot) of Japanese Patent Laid-open Publication No. 2007-38360 includes a plurality of links that are rotatably connected to each other with the joint interposed therebetween and a plurality of motors installed in the joints. Each motor has a hollow type motor rotation axis, and each link is fixed to a hollow type rotation axis fixed to an inner peripheral surface of the hollow type motor rotation axis, and rotates by rotation of the hollow type rotation axis.

The above motor is a direct drive motor that directly transmits generated power to an object with no use of a speed reduction mechanism. For example, the direct drive motor is disclosed in Japanese Patent Laid-open Publication No. 2016-15854. The direct drive motor of Japanese Patent Laid-open Publication No. 2016-15854 includes a motor that generates power, a rotation detector that detects rotation of the motor, and a housing that holds the motor and the rotation detector. The motor includes a stator including a coil and a stator core supporting the coil and a rotor including a permanent magnet. The coil is connected to a power supply through a lead wire.

SUMMARY OF THE INVENTION

In the robot of Japanese Patent Laid-open Publication No. 2007-38360, a direct drive motor is provided in each joint including a wrist joint of the robot arm. However, the robot including one hand mounted on one robot arm is illustrated in Japanese Patent Laid-open Publication No. 2007-38360, but the specific form of the wrist joint in the case that two hands are mounted on one robot arm is not illustrated unlike the robot of Japanese Patent Laid-open Publication No. 2016-162936.

The present invention has been made in view of the above circumstances, and an object of the present invention is to provide a wrist joint structure in which a direct drive motor is used in a robot having two hands mounted on one robot arm.

According to one aspect of the present invention, a robot includes: a robot arm; a plurality of stages of hands including a first hand and a second hand that are provided at a tip of the robot arm; a first direct drive motor in which a rotation axis is defined at the tip of the robot arm, the first direct drive motor coupling the first hand to the tip of the robot arm such that the first hand is rotatable about the rotation axis; and a second direct drive motor that couples the second hand to the first hand such that the second hand is rotatable about the rotation axis.

In the robot, the first direct drive motor functions as a wrist joint of the first hand, and the first direct drive motor and the second direct drive motor function as a wrist joint of the second hand. The two direct drive motors rotate the object (hand) around the common rotation axis. In the robot, for example, when the second hand is held in position while the first hand is rotated about the rotation axis, the first direct drive motor and the second direct drive motor generate rotation force in mutually opposite directions, whereby the first hand receives reaction force from the second hand. The reaction force promotes the rotation of the first hand. In this way, a wrist joint structure, in which the direct drive motors are used, suitable for the robot in which two hands are mounted on one robot arm can be constructed.

According to the present invention, the wrist joint structure, in which the direct drive motors are used, can be provided in the robot in which two hands are mounted on one robot arm.

DETAILED DESCRIPTION OF PREFERRED EMBODIMENTS

Figure 1:
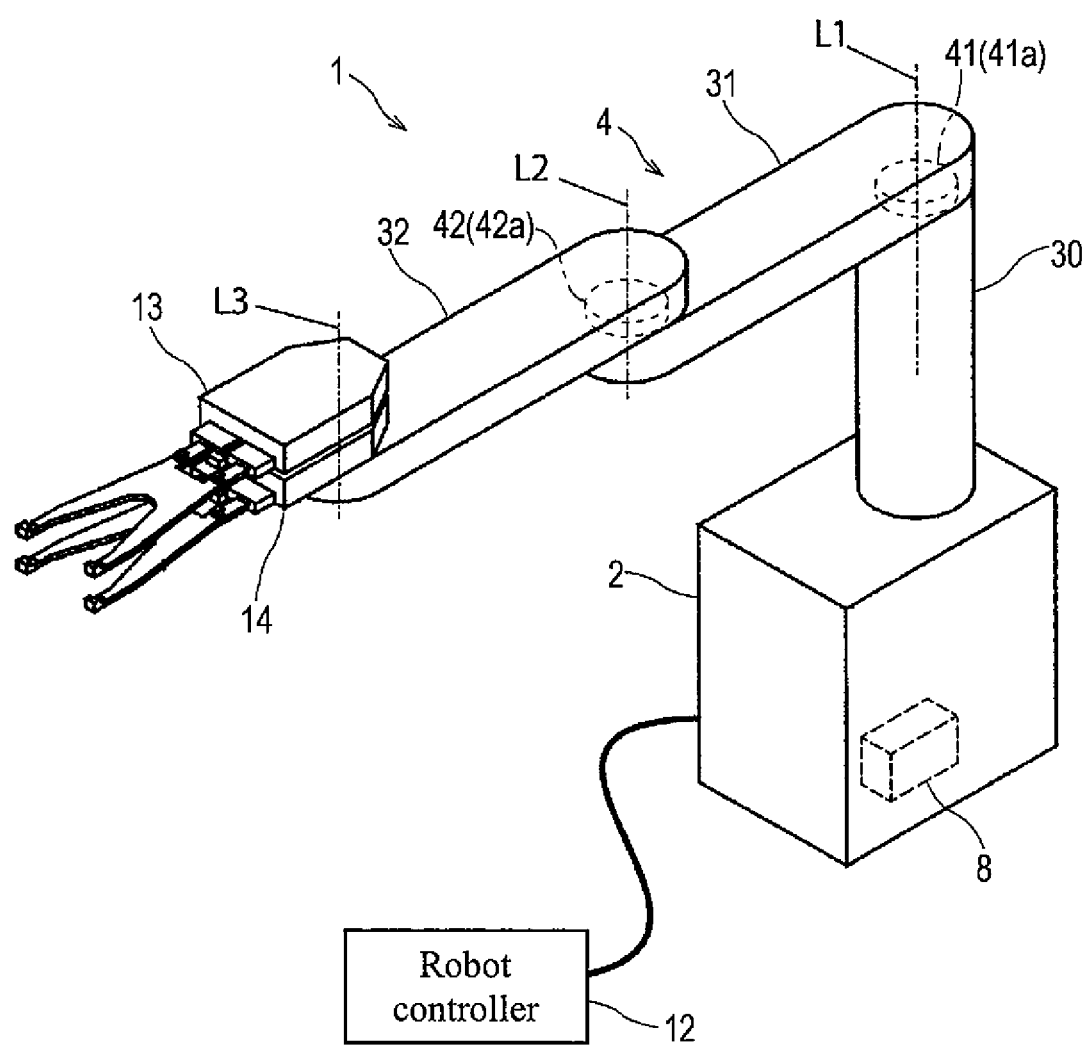
FIG. 1 is a perspective view of a robot according to an embodiment of the present invention.

Hereinafter, an embodiment of the present invention will be described with reference to the drawings. FIG. 1 is a perspective view of a robot 1 according to an embodiment of the present invention. The embodiment will be described by applying the present invention to a substrate transfer robot including a substrate holding hand that is an example of the robot 1. However, the robot 1 is not limited to the substrate transfer robot.

The robot 1 in FIG. 1 includes a base 2, a robot arm 4 supported by the base 2, and a first hand 14 and a second hand 13 that are attached to a hand of the robot arm 4. The robot arm 4 includes a lifting shaft 30, a first link member 31, and a second link member 32 that are connected to each other.

A vertical first rotation axis L1 passing through the base 2 is defined on the base 2. The lifting shaft 30 is supported by the base 2 so as to be lifted up and down along the first rotation axis L1. A lifting drive device 8 that elevates and lowers the lifting shaft 30 is provided in the base 2.

A base end of the first link member 31 is coupled to an upper end of the lifting shaft 30 with a first joint 41 interposed therebetween. The first link member 31 rotates about the first rotation axis L1 by operation of the first joint 41. The first joint 41 includes a direct drive motor 41a. The direct drive motor 41a includes a rotor and a stator (not illustrated), one of the rotor and the stator is fixed to the first link member 31, and the other is fixed to the lifting shaft 30.

The tip of the first link member 31 is coupled to the base end of the second link member 32 with a second joint 42 interposed therebetween. A vertical second rotation axis L2 is defined at the tip of the first link member 31. The second link member 32 rotates about the second rotation axis L2 by the operation of the second joint 42. The second joint 42 includes a direct drive motor 42a. The direct drive motor 42a includes a rotor and a stator (not illustrated), one of the rotor and the stator is fixed to the second link member 32, and the other is fixed to the first link member 31. A vertical third rotation axis L3 is defined at the tip of the second link member 32.

Figure 2:
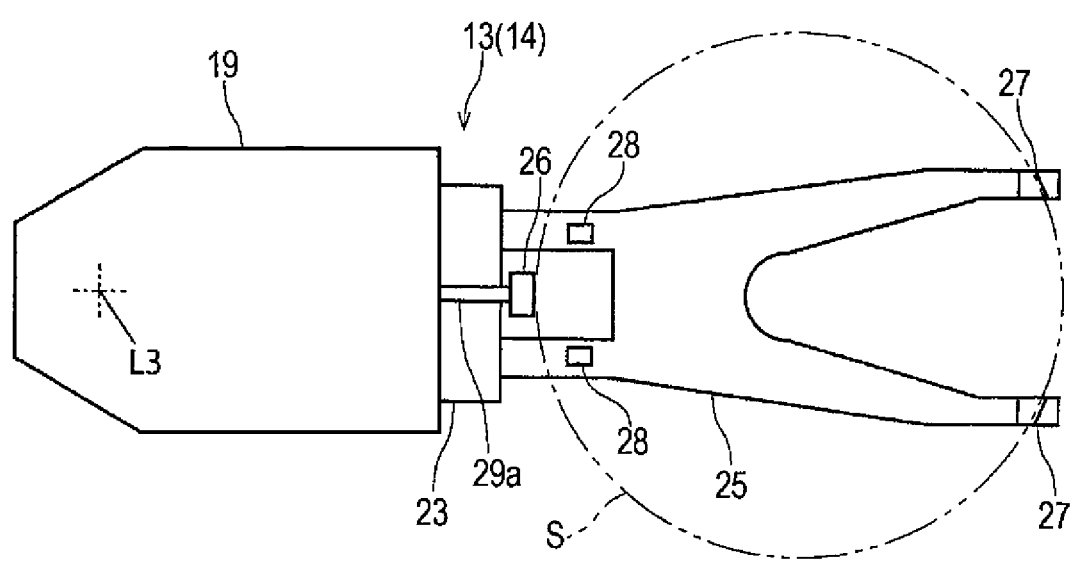
FIG. 2 is a plan view of a second hand (and a first hand)
Figure 3:
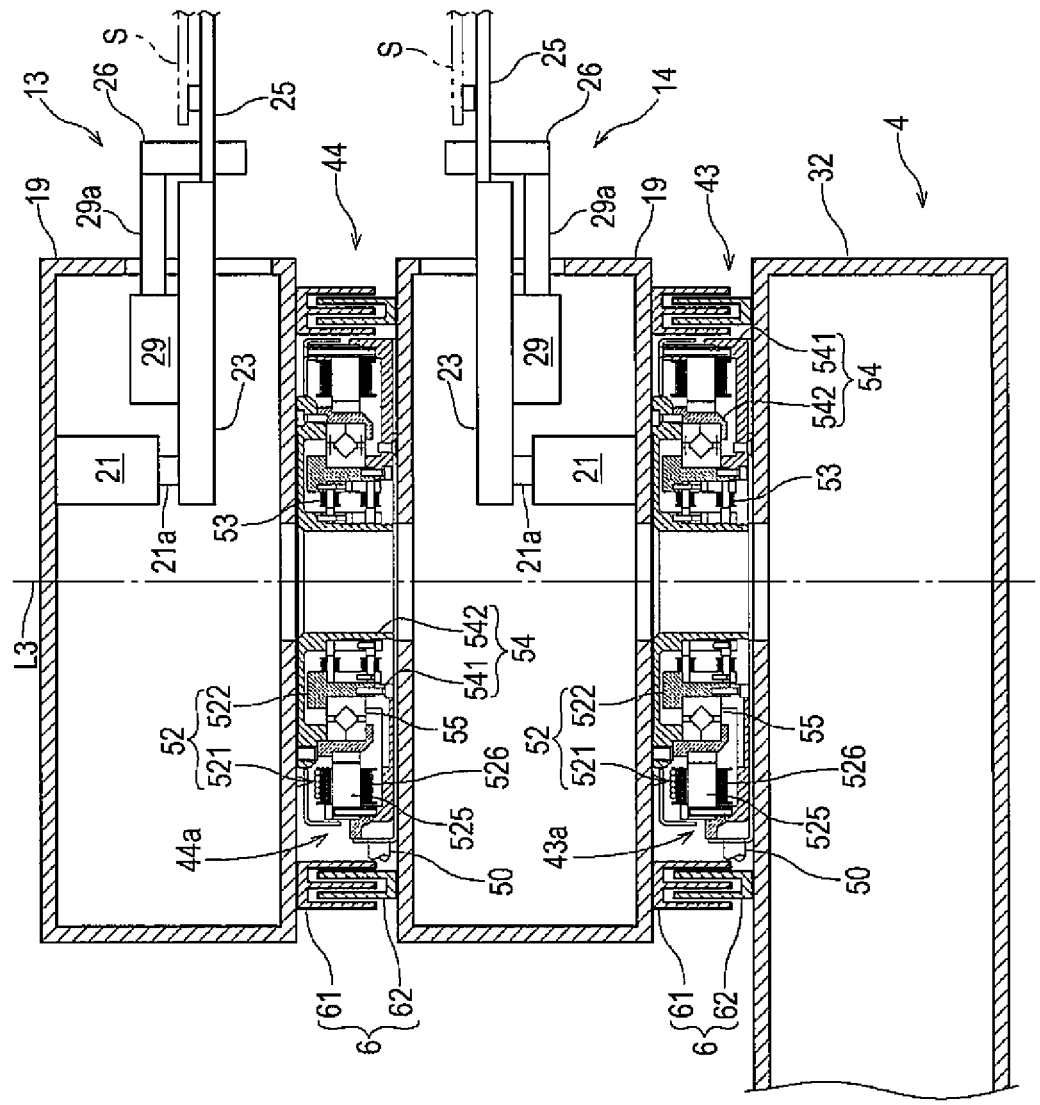
FIG. 3 is a sectional view illustrating a coupling structure between the first hand and the second hand and a robot arm.

FIG. 2 is a plan view of the second hand 13 (and the first hand 14), and FIG. 3 is a sectional view illustrating a coupling structure between the first hand 14 and the second hand 13 and the robot arm 4. Because the second hand 13 and the first hand 14 have a substantially identical structure, the structure of the second hand 13 will be described in detail, and the description of the structure of the first hand 14 will be omitted.

As illustrated in FIGS. 2 and 3, the second hand 13 includes a hand base 19 constructed with a hollow member. A lifting air cylinder 21 is provided in the hand base 19. A lifting member 23 is connected to the tip of a piston 21a of the lifting air cylinder 21. A base end of a blade member 25 that holds a substrate S is connected to the lifting member 23. A pair of gripping claws 27 abutting on an edge of the substrate S is provided on a top surface at the tip of the blade member 25. A pair of pads 28 that supports a bottom surface of the substrate S is provided on the top surface at the base end of the blade member 25.

A pressing air cylinder 29 is provided in the hand base 19. A pusher 26 that presses the substrate S to grip the substrate S together with the gripping claw 27 is provided at the tip of a piston 29a of the pressing air cylinder 29 projecting to an outside of the hand base 19. The lifting air cylinder 21 and the pressing air cylinder 29 operate independently of each other under control of a robot controller 12.

As illustrated in FIG. 3, the hand base 19 of the first hand 14 is coupled to the tip of the second link member 32 with a first wrist joint 43 interposed therebetween. The first hand 14 rotates around the third rotation axis L3 by the operation of the first wrist joint 43. The hand base 19 of the second hand 13 is coupled to the base end of the first hand 14 with a second wrist joint 44 interposed therebetween. The second hand 13 rotates around the third rotation axis L3 by the rotation of the second wrist joint 44. That is, the second hand 13 and the first hand 14 have the common rotation axis.

The first wrist joint 43 and the second wrist joint 44 include direct drive motors 43a, 44a, respectively. The direct drive motor 43a of the first wrist joint 43 includes a rotor 522 and a stator 521. One of the rotor 522 and the stator 521 is fixed to the first hand 14 and the other is fixed to the second link member 32. The direct drive motor 44a of the second wrist joint 44 includes the rotor 522 and the stator 521. One of the rotor 522 and the stator 521 is fixed to the second hand 13 and the other is fixed to the first hand 14.

The direct drive motors 41a, 42a, 43a, 44a included in the first joint 41, the second joint 42, the first wrist joint 43, and the second wrist joint 44 have a substantially identical structure. For this reason, the direct drive motor 44a provided in the second wrist joint 44 will be described in detail, and the detailed description relating to the direct drive motors 41a, 42a, 43a provided in the first joint 41, the second joint 42, and the first wrist joint 43 will be omitted.

The direct drive motor 44a provided in the second wrist joint 44 includes a motor 52 that generates motive power for rotating an object, a rotation detector 53 that detects the rotation of the motor 52, a housing 54 that holds the motor 52 and the rotation detector 53, and a lead wire 50 connected to the motor 52.

The motor 52 includes a stator 521 and a rotor 522 that are opposed to each other with a gap interposed therebetween. The rotor 522 rotates about the third rotation axis L3 with respect to the stator 521. The stator 521 includes a stator core 525 and a coil 526 supported by the stator core 525. The rotor 522 includes a plurality of permanent magnets arranged at equal intervals around the third rotation axis L3.

The stator 521 is connected to a second housing member 542. The rotor 22 is connected to a first housing member 541. A bearing 55 is disposed between the first housing member 541 and the second housing member 542. By the bearing 55, the first housing member 541 is supported so as to be rotatable around the third rotation axis L3 with respect to the second housing member 542.

The operation of the direct drive motor 44a is controlled by the robot controller 12. The robot controller 12 rotates the rotor 522 by a target angle based on a detection result of the rotation detector 53. Further detailed description relating to the structure of the direct drive motor 44a is made by reference to Japanese Patent Laid-open Publication No. 2016-15854.

The direct drive motor 44a is sealed by a labyrinth seal 6 provided around the direct drive motor 44a. In the example of FIG. 3, a first seal member 61 is provided on a bottom surface of the second hand 13 so as to surround a periphery of the direct drive motor 44a, and a second seal member 62 is provided on a bottom surface of the first hand 14 so as to surround the periphery of the direct drive motor 44a. The first seal member 61 and the second seal member 62 are combined in a labyrinth manner to constitute a labyrinth seal 6. The similar labyrinth seal 6 is also provided between the first hand 14 and the second link member 32.

Figure 4:
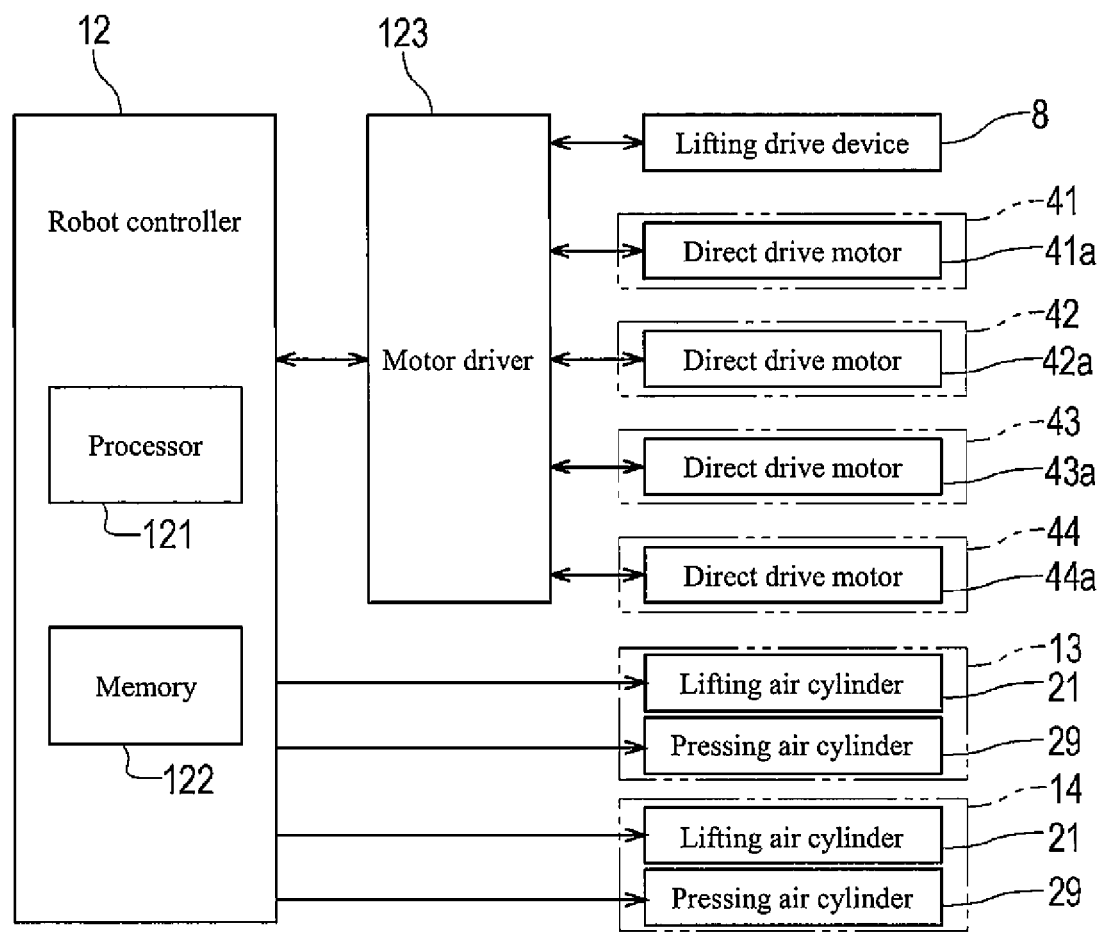
FIG. 4 is a block diagram illustrating a configuration of a control system of a robot.

FIG. 4 is a block diagram illustrating a configuration of a control system of the robot 1. As illustrated in FIG. 4, the robot controller 12 is what is called a computer including a processor 121 and volatile and nonvolatile memories 122. The memory 122 may be constructed with various types of RAM, ROM, flash memory, hard disk, and the like. Various control programs executed by the processor 121 are stored in the memory 122. Various data read by the processor 121 is stored in the memory 122.

The robot controller 12 is electrically connected to the lifting drive device 8, the direct drive motor 41a of the first joint 41, the direct drive motor 42a of the second joint 42, the direct drive motor 43a of the first wrist joint 43, the direct drive motor 44a of the second wrist joint 44, and a drive unit including the pressing air cylinder 29 and the lifting air cylinder 21 of each of the first hand 14 and the second hand 13. The operation of these driving units is controlled by the robot controller 12. An electric motors (not illustrated) of the lifting drive device 8 and the direct drive motors 41a, 42a, 43a, 44a are driven and controlled by a motor driver 123 that receives a control signal from the robot controller 12.

As described above, the robot 1 of the embodiment includes the robot arm 4, the plurality of stages of hands including the first hand 14 and the second hand 13 provided at the tip of the robot arm 4, the first direct drive motor 43a in which the rotation axis (third rotation axis L3) is defined at the tip of the robot arm 4, the first direct drive motor 43a coupling the first hand 14 to the tip of the robot arm 4 such that the first hand 14 is rotatable about the rotation axis, and the second direct drive motor 44a that couples the second hand 13 to the first hand 14 such that the second hand 13 is rotatable around the rotation axis.

In the robot 1, the first direct drive motor 43a functions as the wrist joint (first wrist joint 43) of the first hand 14, and the first direct drive motor 43a and the second direct drive motor 44a functions as the wrist joint (second wrist joint 44) of the second hand 13. The two direct drive motors 43a, 44a rotate the objects (hands 13, 14) about the common rotation axis (third rotation axis L3). In the robot 1, for example, when the second hand 13 is held in position while the first hand 14 is rotated about the third rotation axis L3, the first direct drive motor 43a and the second direct drive motor 44a generate rotation force in mutually opposite directions, whereby the first hand 14 receives reaction force from the second hand 13. The reaction force promotes the rotation of the first hand 14. In this way, a wrist joint structure, in which the direct drive motors 43a, 44a are used, suitable for the robot 1 in which two hands 13, 14 are mounted on one robot arm 4 is constructed.

In the robot 1, as described in the embodiment, the tip of the robot arm 4 and the base end of the first hand 14 are separated from each other in an extending direction of the rotation axis, the first direct drive motor 43a is provided between the tip of the robot arm 4 and the base end of the first hand 14, the base end of the first hand 14 and the base end of the second hand 13 are separated from each other in the extending direction of the rotation axis, and the second direct drive motor 44a is provided between the base end of the first hand 14 and the base end of the second hand 13.

Consequently, the assembly and maintenance of the robot 1 are facilitated by mounting the direct drive motors 43a, 44a on the outside of the hands 13, 14 or the link members 31, 32.

The robot 1 includes the labyrinth seal 6 that seals the periphery of at least one of the first direct drive motor 43a and the second direct drive motor 44a as described in the embodiment.

Consequently, the direct drive motors 43a, 44a can be sealed without obstructing the rotation of the object by the direct drive motors 43a, 44a.

Although the preferred embodiment of the present invention is described above, the details of the specific structure and/or the function of the above embodiment that are changed as follows without departing from the scope of the present invention can also be included in the present invention.

Although the robot 1 of the embodiment includes the horizontal articulated robot arm 4, the robot arm 4 is not limited to this configuration. Alternatively, a known robot arm such as a vertical articulated robot arm and a direct acting robot arm may be adopted.

In the robot 1 of the embodiment, the plurality of stages of hands 13, 14 having the vertical rotation axes are vertically arranged. Alternatively, a plurality of stages of hands 13, 14 having the horizontal axes may horizontally be arranged.

What is claimed is:

1. A robot comprising:
   a robot arm;
   a plurality of stages of hands including a first hand and a second hand that are provided at a tip of the robot arm;
   a first direct drive motor in which a rotation axis is defined at the tip of the robot arm, the first direct drive motor coupling the first hand to the tip of the robot arm such that the first hand is rotatable about the rotation axis; and
   a second direct drive motor that couples the second hand to the first hand such that the second hand is rotatable about the rotation axis, wherein
   the first direct drive motor includes a first rotor and a first stator,
   the second direct drive motor includes a second rotor and a second stator,
   one of the first rotor and the first stator is fixed to the first hand and the other is fixed to the robot arm, and
   one of the second rotor and the second stator is fixed to the first hand and the other is fixed to the second hand.

2. The robot according to claim 1, wherein
   the tip of the robot arm and a base end of the first hand are separated from each other in an extending direction of the rotation axis, the first direct drive motor being provided between the tip of the robot arm and the base end of the first hand, and
   the base end of the first hand and a base end of the second hand are separated from each other in the extending direction of the rotation axis, the second direct drive motor being provided between the base end of the first hand and the base end of the second hand.

3. The robot according to claim 2, further comprising a labyrinth seal that seals a periphery of at least one of the first direct drive motor and the second direct drive motor.

* * * * *